US006890791B2

United States Patent
Ohtsuka et al.

(10) Patent No.: US 6,890,791 B2
(45) Date of Patent: May 10, 2005

(54) COMPOUND SEMICONDUCTOR SUBSTRATES AND METHOD OF FABRICATION

(75) Inventors: Koji Ohtsuka, Niiza (JP); Junji Sato, Niiza (JP); Tetsuji Moku, Niiza (JP); Masahiro Sato, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/813,488

(22) Filed: Mar. 30, 2004

(65) Prior Publication Data

US 2004/0232440 A1 Nov. 25, 2004

(30) Foreign Application Priority Data

May 21, 2003 (JP) ........................................ 2003-143328

(51) Int. Cl.[7] .............................................. H01L 21/00
(52) U.S. Cl. .............................. 438/94; 438/46; 438/47
(58) Field of Search ........................ 438/94, 22, 46–47; 257/194, 190

(56) References Cited

U.S. PATENT DOCUMENTS 4,283,591 A * 8/1981 Boer ........................... 136/256
4,677,250 A * 6/1987 Barnett et al. ............... 136/258
5,279,678 A * 1/1994 Jordan et al. ................ 136/244

FOREIGN PATENT DOCUMENTS

JP        2001/313421 A    11/2001

* cited by examiner

*Primary Examiner*—Phat X. Cao
*Assistant Examiner*—Theresa T. Doan
(74) *Attorney, Agent, or Firm*—Woodcock Washburn LLP

(57) ABSTRACT

A semiconductor substrate for a light-emitting diode, heterojunction transistor or the like. Included is a buffer region of an aluminum-containing nitride or the like grown epitaxially on a baseplate of silicon or a silicon compound. A dislocation-refracting region of an indium-containing nitride is grown epitaxially on the buffer region in order to provide a major surface having a multiplicity of protuberances of pyramidal shape capable of refracting the dislocations created in the buffer region. A leveling region of a nitride, not containing indium, is formed on the major surface of the dislocation refracting region in order to provide a major surface of greater levelness than the transition refracting region. The leveling region is reduced in dislocation density owing to the interposition of the dislocation refracting region between buffer region and leveling region.

3 Claims, 3 Drawing Sheets

COMPOUND SEMICONDUCTOR SUBSTRATES AND METHOD OF FABRICATION

RELATED APPLICATIONS

This application claims priority to Japanese Patent Application No. 2003-143328 filed May 21, 2003.

BACKGROUND OF THE INVENTION

This invention relates to semiconductor substrates, and particularly to the improved configuration, and a method of fabrication, of semiconductor substrates which lend themselves to use in nitric compound semiconductor devices such as light-emitting diodes (LEDs) and heterojunction transistors, among other applications.

Nitric compounds such as gallium nitride (GaN), gallium aluminum nitride (GaAlN), gallium indium nitride (GaInN), and aluminum gallium indium nitride (AlGaInN) have been used extensively for production of semiconductor devices. Japanese Unexamined Patent Publication No. 2001-313421 teaches the fabrication of a nitric semiconductor region upon a silicon substrate via a buffer layer.

FIG. 1 shows a semiconductor substrate of the above conventional make. The semiconductor substrate has a silicon baseplate 1, a buffer layer 2 of aluminum nitride (AlN) or the like grown epitaxially on the baseplate, and a nitric semiconductor layer 3 of gallium nitride or the like grown epitaxially on the buffer layer. An additional layer capable of light emission is formed on the nitric semiconductor layer 3 for production of LEDs. An additional semiconductor layer is also formed on the nitric semiconductor layer 3 for production of heterojunction transistors or like controllable semiconductor devices.

The boundary between silicon baseplate 1 and buffer layer 2 forms a heterojunction, with a lattice and thermal discontinuity. For this reason, as indicated explanatorily by the broken lines designated 4 in FIG. 1, numerous dislocations conventionally took place across the buffer layer 2. The dislocations might also be termed line defects or dislocation lines. Oriented normal to the major surfaces of the baseplate 1, the dislocations extended into the nitric semiconductor layer 3, with a dislocation density of $5 \times 10^{10}/cm^2$ or more, which is detrimental to the performance of the semiconductor device. More specifically, in the case of an LED, the dislocations extended into the light-emitting layer to provide recombination centers that do not emit light and so decrease the efficiency of glowing. Also, in the case of dislocations contained in the semiconductor regions having controllable semiconductor devices such as high electron mobility transistors formed therein, the carriers were scattered by the electrons captured by the dislocations, lowering carrier mobility. The dislocations extended to the surfaces of the semiconductor regions having the semiconductor devices, causing abnormal dispersion of the electrode material on the surfaces, with a consequent decrease in voltage withstanding capability.

SUMMARY OF THE INVENTION

It is therefore an object of this invention to reduce such dislocations in semiconductor substrates.

Briefly stated in one aspect thereof, the present invention provides a method of fabricating a semiconductor substrate for a compound semiconductor device. A buffer region is formed, possibly with dislocations, on a baseplate by epitaxial growth of a first compound semiconductor. Then a second compound semiconductor is grown epitaxially on a major surface of this buffer region to create what is herein termed a dislocation refracting region. This dislocation refracting region has a major surface with a multiplicity of protuberances capable of refracting extensions of the dislocations from the buffer region. Then a third compound semiconductor is grown epitaxially on the major surface of this dislocation refracting region, thereby creating a leveling region which has a major surface of greater levelness than the major surface of the dislocation refracting region and which is less in dislocation density than the dislocation refracting region.

Thus the dislocations which have been unavoidably created in the buffer region are refracted by the surface protuberances of the overlying dislocation refracting region away from the leveling region. This leveling region is less in dislocation density than the buffer region and the dislocation refracting region. Although the dislocation refracting region has a rough major surface because of the protuberances, this presents no problem at all in use of the semiconductor substrate because the overlying leveling surface provides a much smoother major surface.

Another aspect of the invention concerns the configuration of a semiconductor substrate for a compound semiconductor device. The semiconductor substrate comprises: (a) a baseplate; (b) a buffer region of a first compound semiconductor formed, possibly with dislocations, on the baseplate; (c) a dislocation refracting region of a second compound semiconductor, different from the first compound semiconductor, formed on a major surface of the buffer region, the dislocation refracting region having a major surface with a multiplicity of protuberances capable of refracting extensions of the dislocations from the buffer region; and (d) a leveling region of a third compound semiconductor, different from the second compound semiconductor, formed on the major surface of the dislocation refracting region, the leveling region having a major surface of greater levelness than the major surface of the dislocation refracting region.

The baseplate of the above improved semiconductor substrate according to the invention must be of a substance that permits epitaxial growth of compound semiconductors thereon. Examples of such substances include silicon, a silicon compound such as silicon carbide, and sapphire. Most desirably, from the standpoints of manufacturing costs and electroconductivity, the baseplate is of an electroconductive silicon containing conductivity-determinant impurities.

The buffer region may be of AlN or other nitride containing aluminum, such as $Al_xGa_{1-x}N$ where x is greater one zero and less than one.

Alternatively, the buffer region may be of a lamination of a first layer of an aluminum-containing nitride overlying the baseplate, and a second layer of a gallium-containing nitride overlying the first layer. The aluminum-containing nitride may be, for example, either AlN or $Al_xGa_{1-x}N$ where x is greater one zero and less than one. The gallium-containing nitride may be, for example, either GaN or $Al_yGa_{1-y}N$ where y is greater than zero, less than one, and less than x.

As another alternative, the buffer region may be of an alternating lamination of first layers of an aluminum-containing nitride and second layers of a gallium-containing nitride. The aluminum-containing nitride may be, for example, either AlN or $Al_xGa_{1-x}N$ where x is greater one zero and less than one. The gallium-containing nitride may be, for example, either GaN or $Al_yGa_{1-y}N$ where y is greater than zero, less than one, and less than x.

As still another alternative, the buffer region may be a lamination of a first buffer subregion of multilayer construction and a second buffer subregion of monolayer construction. The first buffer subregion may be of an alternating lamination of first layers of an aluminum-containing nitride and second layers of a gallium-containing nitride. The aluminum-containing nitride may be, for example, either AlN or $Al_xGa_{1-x}N$ where x is greater one zero and less than one. The gallium-containing nitride may be, for example, either GaN or $Al_yGa_{1-y}N$ where y is greater than zero, less than one, and less than x. The second buffer subregion may be of a gallium-containing nitride such as GaN or $Al_yGa_{1-y}N$ where y is greater than zero, less than one, and less than x. Desirably, both buffer subregions should not contain indium.

The dislocation refracting region may be of an indium-containing nitride such as $Al_xIn_yGa_{1-x-y}N$ where x is equal to or greater than zero and less than one, and y is greater than zero and less than one.

Alternatively, the dislocation refracting region may be of an alternating lamination of first layers of a nitride containing indium in a first proportion, and second layers of a nitride containing indium in a second proportion which is greater than the first proportion. The nitride containing indium in the first proportion may be, for example, $Al_xIn_yGa_{1-x-y}N$ where x is equal to or greater than zero and less than one, and y is greater than zero and less than one. The nitride containing indium in the second proportion may be, for example, $Al_aIn_bGa_{1-a-b}N$ where a is equal to or greater than zero and less than one; b is greater than zero and less than one; and y is less than b.

The leveling region may be a nitride not containing indium, such as $Al_xGa_{1-x}N$ where x is equal to or greater than zero and less than one.

Alternatively, the leveling region may be of an alternating lamination of first layers of an aluminum-containing nitride and second layers of a gallium-containing nitride. The aluminum-containing nitride may be, for example, $Al_xGa_{1-x}N$ where x is greater one zero and less than one. The gallium-containing nitride may be, for example, either GaN or $Al_yGa_{1-y}N$ where y is equal to or greater than zero, less than one, and less than x. Both first and second layers should not contain indium.

The invention also provides a semiconductor substrate for a compound semiconductor device, comprising: (a) a baseplate of silicon or a silicon compound, a first semiconductor region formed on the baseplate by epitaxial growth of a nitride not containing indium; (b) a second semiconductor region formed on a major surface of the first semiconductor region by epitaxial growth of a nitride containing indium; (c) and a third semiconductor region formed on a major surface of the second semiconductor region by epitaxial growth of a nitride not containing indium, the third semiconductor region having a major surface of greater levelness than the major surface of the second semiconductor region and being less in dislocation density than the second semiconductor region.

Preferably, the noted buffer region, dislocation refracting region, and leveling region should all contain conductivity-determinant impurities. It is also preferred that the major surface of the dislocation refraction region be formed to include protuberances each approximately in the shape of a hexagonal pyramid and ranging in height from 30 to 1000 nanometers.

Taken in its specific aspects, the invention is perhaps best characterized by the numerous pyramidal protuberances on the major surface of the dislocation refracting region. These protuberances function to refract the dislocations transitions that have extended into the dislocation refracting region from the underlying buffer region and hence to prevent the dislocations from extending further into the leveling region. A drastic decrease is thus achieved in the dislocation densities of the leveling region and the semiconductor region to be formed thereon for production of desired semiconductor devices. It is expected that the resulting semiconductor devices will be far better in performance than their conventional counterparts.

The above and other objects, features and advantages of this invention will become more apparent, and the invention itself best understood, from the following description of some preferable embodiments taken together with the attached drawings.

DETAILED DESCRIPTION OF ILLUSTRATIVE EMBODIMENTS

The present invention can be embodied in various forms depending upon its intended applications. Several different forms of semiconductor substrates according to the invention will therefore be disclosed, both as to their constructions and methods of fabrication.

Figure 1:
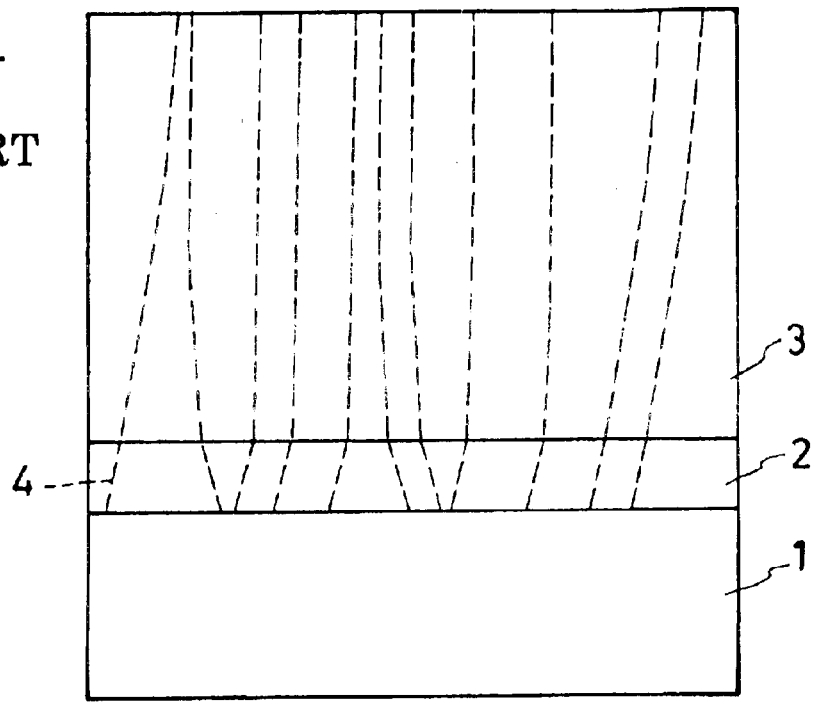
FIG. 1 is a diagrammatic sectional view of the prior art semiconductor substrate.
Figure 2:
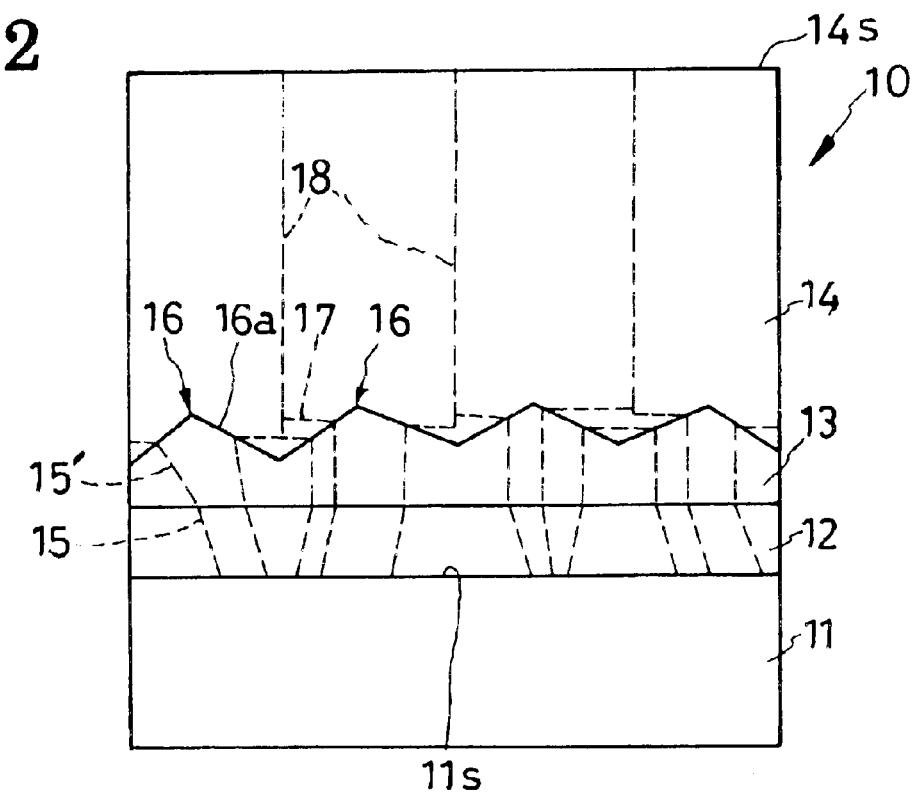
FIG. 2 is a diagrammatic sectional view of a preferred form of semiconductor substrate according to the invention.

Embodiment of FIG. 2

The semiconductor substrate according to the invention is shown in its fundamental form in FIG. 2. The reference numeral 10 in this figure generally denotes a semiconductor substrate for a nitric compound semiconductor device such as an LED or a controllable transistor. The substrate 10 is a lamination of a silicon semiconductor baseplate 11, a buffer region 12 as a first semiconductor region overlying the baseplate 11 for lattice relaxation, a dislocation refracting region 13 as a second semiconductor region overlying the buffer region, and a leveling region 14 as a third semiconductor region overlying the dislocation refracting region. The LED or controllable transistor is to be formed on the exposed major surface $14_s$ of the leveling region 14. The buffer region 12 is characterized by the presence of indium, the dislocation refracting region 13 by the presence of indium, and the leveling region 14 by the absence of indium, as will become more apparent from the following description of the manufacturing method.

The fabrication of the semiconductor substrate 10 starts with the preparation of the silicon baseplate 11 with a thickness of approximately 350 micrometers. The silicon baseplate might also be termed the silicon substrate. Being intended for a current path of the desired semiconductor device, the baseplate 11 should contain impurities that determine the conductivity type, with a density ranging from $5\times10^{18}$ to $5\times10^{19}$ cm$^{-3}$, and an electrical resistivity as low as from 0.0001 to 0.0100 ohm·centimeter. In order to expedite the subsequent epitaxial growth of the buffer region 12 thereon, the major surface $11_s$ of the silicon baseplate 11 should be the face (111) according to the Miller indices.

Preferably after the hydrogen terminal treatment of the baseplate 11 with a hydrogen fluoride etching solution, the baseplate 11 was placed in an organometallic vapor phase epitaxy (OMVPE) reaction chamber of conventional make and therein heated to a temperature of 1150° C. The baseplate 11 was stripped of the oxide film from its surfaces by 10 minutes thermal cleaning at that temperature. Then the baseplate 11 was allowed to cool down to a temperature of 1100° C.

White being stably maintained at this lower temperature, the baseplate 11 was exposed to a mixed flow of 50 μmol/min (20 cc) of trimethylaluminum (TAM), 20 nmol/min (200 cc) of silane (SiH$_4$), and 0.14 mol/min (3 l.) of ammonia (NH$_3$), thereby causing AlN to grow epitaxially on the major surface $11_s$ of the baseplate. There was thus created the buffer region 12 with a thickness of 300 angstroms, which was silicon doped by the addition of silicon as an n-type impurity. As indicated by the broken lines in FIG. 2, the buffer region 15 apparently contained numerous dislocations 15 mostly oriented normal to the major surface $11_s$ of the baseplate 11.

Next comes the step of creating the dislocation refracting region 13 on the buffer region 12 in order to prevent the extension of the dislocations 15 any further. Toward this end the baseplate 11 in the reaction chamber was allowed to cool to about 900° C. following the termination of the introduction of the growth materials other than NH$_3$. Then, for epitaxial growth of the dislocation refracting region 13, a mixture of 95 μmol/min (200 cc) of trimethyl indium (TMIn), 5.3 μmol/min (2.1 cc) of trimethyl gallium (TMG), 0.23 mol/min (5 l.) of NH$_3$, and 20 μmol/min (200 cc) of SiH$_4$ was introduced into the reaction chamber for 950 seconds.

The dislocation refracting region 13 was thus formed on the buffer region 12 to a thickness of about 100 nanometers, with numerous protuberances 16 on its major surface. This particular dislocation refracting region 13 was of a nitric semiconductor of the composition expressed by the formula In$_y$Ga$_{1-y}$N where y is greater than zero and less than one, preferably 0.15. It is not intended, however, that the composition of the dislocation refracting region 13 according to the invention be limited to this particular nitride. Speaking more broadly, the dislocation refracting region 13 can be fabricated from any indium-containing nitride expressed by the general formula, Al$_x$In$_y$Ga$_{1-x-y}$N, where x is equal to or greater than 0 and less than one, preferably from 0 to 0.5, and y is greater than zero and less than one, preferably from 0.01 to 0.50. It will be observed from FIG. 2 that the dislocation refracting region 13 itself contains dislocations 15' as continuations of the dislocations 15 in the buffer region 12.

Formed as above by epitaxial growth of an indium-containing nitride, the dislocation refracting region 13 functions to mitigate the lattice defects of the underlying buffer region 12. The result is an uneven distribution of indium in the dislocation refracting region 13. Obviously for this reason, there appeared on the major surface of the dislocation refracting region 13 numerous protuberances 16 each in the approximate shape of a hexagonal pyramid and having an average height of about 80 nanometers. Although this major surface of the dislocation refracting region 13 was therefore much poorer in flatness than that of the buffer region 12, this is to present no problem at all as the leveling region 14 is to be subsequently formed thereon. The sloping flanks $16_a$ of the hexagonal-pyramidal protuberances 16 function to refract the dislocations 15', in such a manner that the dislocations that have extended through the dislocation refracting region 13 approximately perpendicular to the major surface $11_s$ of the baseplate 11 are reoriented approximately parallel to the baseplate surface $11_s$. This reorientation of the dislocations is conducive to the desired reduction of dislocation density in the leveling region 14 to be formed subsequently, as will be detailed later.

The next step is the creation of the leveling region 14 on the dislocation refracting region 13. The reaction chamber was heated toward this end to a temperature of 1100° C. after terminating the charging of TMG, TMIn, and SiH$_4$. Then a mixture of 50 μmol/min (15 cc) of TMG, 20 nmol/min (200 cc) of SiH$_4$, and 0.14 mol/min (3 l.) of NH$_3$ was introduced into the reaction chamber for 540 seconds. There was thus grown on the dislocation refracting region 13 the leveling region 14 of gallium nitride to a thickness of 0.2 micrometer. The leveling region 14 was of n-type conductivity owing to the silicon content of SiH$_4$.

With the OMVPE growth of the gallium nitride semiconductor on the uneven major surface of the dislocation refracting region 13, the nitride semiconductor obviously grew not only in a direction away from the major surface $11_s$ of the baseplate 11 but parallel thereto. The spaces among the protuberances 16 were therefore all filled up by the nitride semiconductor, with the consequent creation of a flat major surface $14_s$ for the leveling region 14. The leveling region 14 was much less in dislocation density than the dislocation refracting region 13. What is considered a most reasonable explanation for this is as follows:

Extending parallel to the baseplate surface $11_s$ from the flanks 16a of the protuberances 16 through the leveling region 14, the dislocations 17 will terminate upon encounter with like dislocation extensions from the neighboring protuberances. Although these dislocations 17 will give rise to dislocations 18 extending normal to the substrate surface $11_s$, the density of the dislocations 18 in the leveling region 14 must be much less than that in the buffer region 12 or dislocation refracting region 13, particularly so at and adjacent the exposed major surface $14_s$ of the leveling region. That is, an average density of the dislocations at the leveling region 14 is less than an average density of the dislocations at the dislocation refracting region 13.

An LED may be formed on the surface $14_s$ of the leveling region 14 as a possible application of this embodiment of the invention. For that purpose, a known active layer, a p-type cladding layer, and a contact layer may be formed sequentially on the surface $14_s$ by the OMVPE method. For production of a controllable semiconductor device such as a high electron mobility transistor, on the other hand, an electron supply layer of a nitride semiconductor such as AlGaN or the like may be formed. In either case, being formed on the leveling region 14 of reduced dislocation density, such additional nitride semiconductor regions will be correspondingly low in dislocation density, making possible the production of semiconductor devices of improved performance characteristics. Incidentally, the leveling region 14 of the semiconductor substrate 10 lends itself to use both as n-type cladding layer of an LED and as n-type semiconductor region of a controllable semiconductor device.

Figure 3:
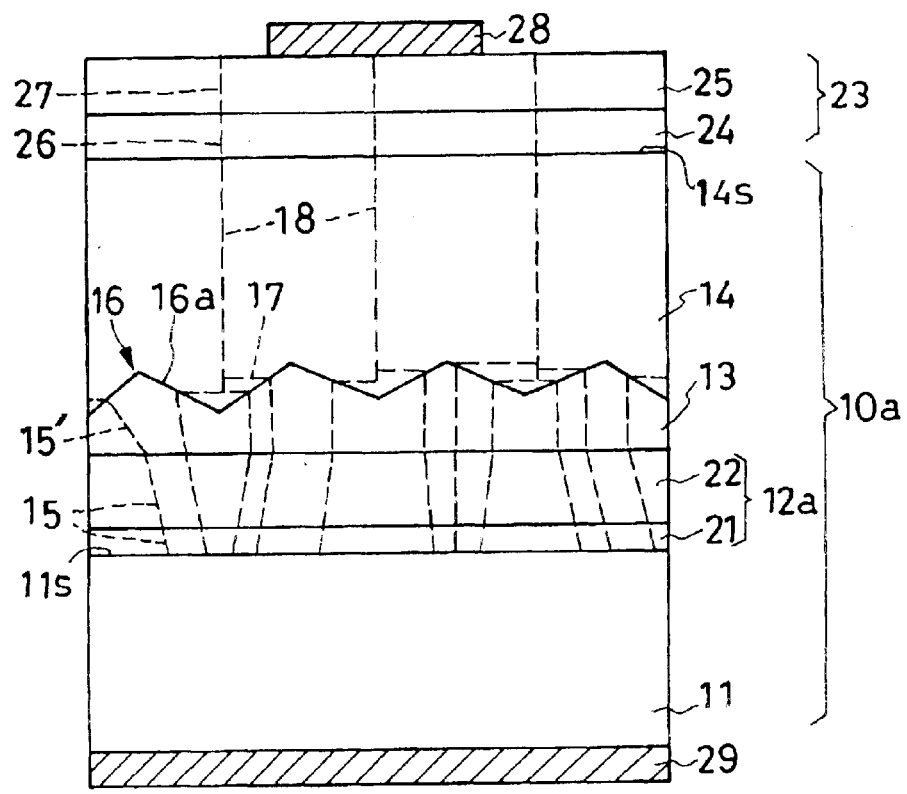
FIG. 3 is a diagrammatic sectional view of another preferred form of semiconductor substrate according to the invention, the substrate being herein shown as a part of an LED.

Embodiment of FIG. 3

Another preferred form of semiconductor substrate according to the invention, as well as an LED using the same, will be described with reference to FIG. 3. The semiconductor substrate $10_a$ shown here differs from its FIG. 2 counterpart 10 only in the makeup of its buffer region $12_a$. The other parts of the semiconductor substrate $10_a$, the baseplate 11, dislocation refracting region 13, and leveling region 14, are of the same constitutions, and fabricated by the same methods, as their counterparts of the FIG. 2 semiconductor substrate 10.

The buffer region $12_a$ is constituted of two subregions or layers 21 and 22. The first buffer subregion 21 is fabricated from a nitride containing aluminum, such as AlN, and by the same method as the buffer region 12 of the FIG. 2 semiconductor substrate 10. The second buffer subregion 22 is of a nitride containing gallium such as GaN, grown epitaxially on the first buffer subregion 21. The second buffer subregion 22 can be formed by the same method as is the leveling region 14 of the FIG. 2 semiconductor substrate 10, the introduction of the mixture of TMG, $SIH_4$ and $NH_3$ into the reaction chamber for epitaxial growth of GaN by OMVPE.

However, in the broader aspect of the invention, the first buffer subregion 21 may be fabricated from any nitrides that can be expressed as $Al_xGa_{1-x}N$ where x is greater than zero and less than one. The second buffer subregion 22 be fabricated from any nitrides that can be expressed as $Al_yGa_{1-y}N$ where y is greater than zero, less than one, and less than x. Not containing indium, the second buffer subregion 22 provides a surface of greater flatness than does the overlying, indium-containing dislocation refracting region 13.

A comparison of the broken lines 15 and 15' in FIGS. 2 and 3 will show that dislocations occur in the modified buffer region $12_a$ and dislocation refracting region 13 of the FIG. 3 semiconductor substrate $10_a$ with approximately the same orientations and same densities as in their counterparts 12 and 13 of the FIG. 2 substrate 10. The dislocation refracting region 13 of the FIG. 3 substrate $10_a$ is akin in configuration to that of the FIG. 2 substrate 10, both having numerous protuberances 16 on their major surfaces. The overlying leveling region 14 is therefore far less in the density of dislocations 18 than the dislocation refracting region 13.

The reference numeral 23 in FIG. 3 generally denotes a semiconductor device region for constituting an LED in combination with the substrate $10_a$. Directly overlying the leveling region 14, which serves as n-type cladding layer for the LED, of the semiconductor substrate $10_a$, the semiconductor device region 23 comprises an active layer 24 of the familiar multiple quantum well construction and a p-type cladding layer 25 of the known p-type GaN composition. The active layer 24 is shown here simplified; in practice, it may be constituted of alternating four barrier layers and four well layers.

The active layer 24 of the noted alternating barrier and well layers may be fabricated immediately after the production of the semiconductor substrate $10_a$. For this purpose, with the charging of the gases into the reaction chamber terminated upon completion of the leveling region 14 the baseplate 11 may be allowed to cool to 800° C. Then a mixture of TMG, TMI, and ammonia of prescribed proportions may be introduced into the reaction chamber thereby forming on the leveling region 14 a barrier layer having a composition of $In_{0.02}Ga_{0.98}N$ and a thickness of 13 nanometers. Then, only with a change in the proportion of TMI, there may likewise be formed on the barrier layer a well layer having a composition of $In_{0.2}Ga_{0.8}N$ and a thickness of three nanometers. The fabrication of the same barrier layer and same well layer may be repeated four times to complete the multiple quantum well active layer 24. This active layer will possess some t dislocations 26 as extensions from the dislocations 18 in the leveling region 14. These dislocations 26 will be so scarce, however, that they will hardly affect the performance of the LED.

The active layer 24 need not be of multiple quantum well design but may be of single quantum well construction. The active layer 24 could also be a single semiconductor layer not doped with impurities; that is, it could be of double heterojunction construction.

The p-type cladding layer 25 of p-type GaN composition is formed to a thickness of 200 nanometers on the active layer 24. This cladding layer may be created immediately after the production of the active layer 24 on the leveling region 14, by raising the temperature of the baseplate 11 to 1010° C. and by charging a mixture of TMG, bis-cyclo pentadinylmagnesium ($Cp_2Mg$), and $NH_3$ into the reaction chamber. The magnesium contained in the $Cp_2Mg$ gas serves as p-type impurity. This cladding layer will also possess only as many dislocations 27 as there are dislocations 26 in the active layer 24.

An electrode 28 is formed on the cladding layer 25, and another 29 on the baseplate 11, for current flow through the substrate $10_a$ and semiconductor device region 23. A p-type semiconductor layer could additionally be formed on the cladding layer 25 for better contact with the electrode 28.

Thus, in the LED constructed as in FIG. 3, far less dislocations exists in the leveling region 14, active layer 24 and cladding layer 25 than in the buffer region $12_a$. The glowing efficiency of the LED is therefore greatly improved through reduction of nonglowing recombination centers.

Figure 4:
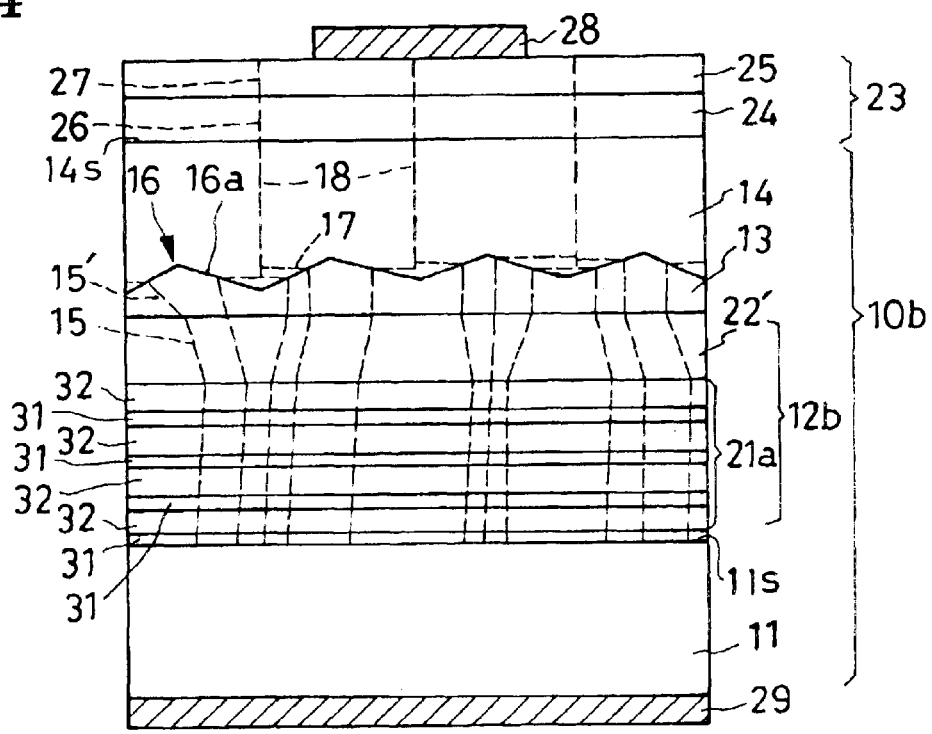
FIG. 4 is a diagrammatic sectional view of still another preferred form of semiconductor substrate according to the invention, the substrate being shown also as a part of an LED.

Embodiment of FIG. 4

FIG. 4 shows another LED using a different form of semiconductor substrate according to the invention. The substrate $10_b$ of this second LED differs from the substrate $10_a$ of the FIG. 3 LED only in the construction of the buffer region $12_b$. All the other parts of the second LED are therefore designated by the same reference numerals as used to denote the corresponding parts of the FIG. 3 LED.

Interposed between baseplate 11 and dislocation refracting region 13 as in the other semiconductor substrates 10 and $10_a$, the modified buffer region $12_b$ is a lamination of a first buffer subregion $21_a$ and second buffer subregion 22'. The first buffer subregion $21_a$, which corresponds to the single-layer first buffer subregion 21 of the FIG. 3 semiconductor substrate $10_a$, is an alternation of a plurality of AlN layers 31 and a plurality of GaN layers 32. The four AlN layers 31 and four GaN layers 32 are shown in FIG. 4 for simplification purposes; in practice, there may be provided as many as, say, twenty AlN layers 31 and just as many GaN layers 32. Both AlN and GaN layers are silicon doped for n-type conductivity.

The fabrication of the multilayered first buffer subregion $21_a$ of the buffer region $12_b$ is possible by OMVPE. Placed in the reaction chamber, the baseplate 11 had first its oxide films removed from the surfaces as in the first disclosed embodiment of the invention. Then, after heating the baseplate 11 to 1100° C., there were introduced into the reaction chamber 50 μmol/min (20 cc) of TAM, 20 nmol/min (200 cc) of SiH$_4$, and 0.14 mol/min (3 l.) of NH$_3$, thereby causing AlN to grow epitaxially on the major surface 11$_s$ of the baseplate. A first AlN layer 31 was thus created on the baseplate 11 to a thickness of five nanometers. Then the introduction of TAM was terminated, but that of SiH$_4$ and NH$_3$ continued at the noted rates, and there was also introduced into the reaction chamber 50 μmol/min (15 cc) of TMG. A first GaN layer 32 was thus grown epitaxially on the first AlN layer 31 to a thickness of 25 nanometers. The foregoing cycle of creating one AlN layer 31 and one GaN layer 32 was repeated twenty times to complete the multilayer first buffer subregion 21$_a$ of the modified buffer region 12$_b$.

The second buffer subregion 22' of the modified buffer region 12$_b$ may be formed just like the second buffer subregion 22 of the FIG. 3 semiconductor substrate 10$_a$.

The dislocations 15 taking place in the modified buffer region 12$_b$ of the FIG. 4 semiconductor substrate 10$_b$, as in the buffer region 12$_a$ of the FIG. 3 substrate 10$_a$, are mostly prevented by the overlying dislocation refracting region 13 from intruding into the leveling region 14 and semiconductor device region 23. A permeative electron microscope study revealed that the density of the dislocations across the active layer 24 of the FIG. 4 device was 9×10$^9$/cm$^2$. By way of comparison a prior art semiconductor device was produced which was equal in construction to that of FIG. 4 except for the absence of the dislocation refracting region 13. A similar study of the dislocation density of the active layer 24 of this conventional device was 5×10$^{10}$/cm$^2$, approximately five times as high as that according to this invention.

The performance of the FIG. 4 LED was also measured and compared with that according to the prior art. The optical output power of the FIG. 4 device was 9.5 milliwatts when a current of 20 milliamperes was made to flow between the electrodes 28 and 29. Measured by the same method, the output power of the prior art device (similar in construction to the FIG. 4 device except for the absence of the dislocation refracting region 13) was 3.2 milliwatts, almost only one third of that according to the present invention.

The AlN layers 31 of the first buffer subregion 21$_a$ of the FIG. 4 substrate 10$_b$ are intermediate in lattice constant between silicon and GaN, so that they can better replicate the crystal orientation of the silicon baseplate 11. However, should this buffer subregion be of a single, thicker AlN layer alone, it would be inordinately high in electrical resistance, but then sufficient buffering function would be obtained, either, if the buffer subregion were of a single, thin AlN layer. The buffer region 12$_b$ according to the invention is sufficiently low in resistance as its first subregion 21$_a$ is an alternation of a multiplicity of AlN layers 31 and a multiplicity of GaN layers 32, with each AlN layer made so thick as to provide the quantum mechanical tunnel effect.

Figure 5:
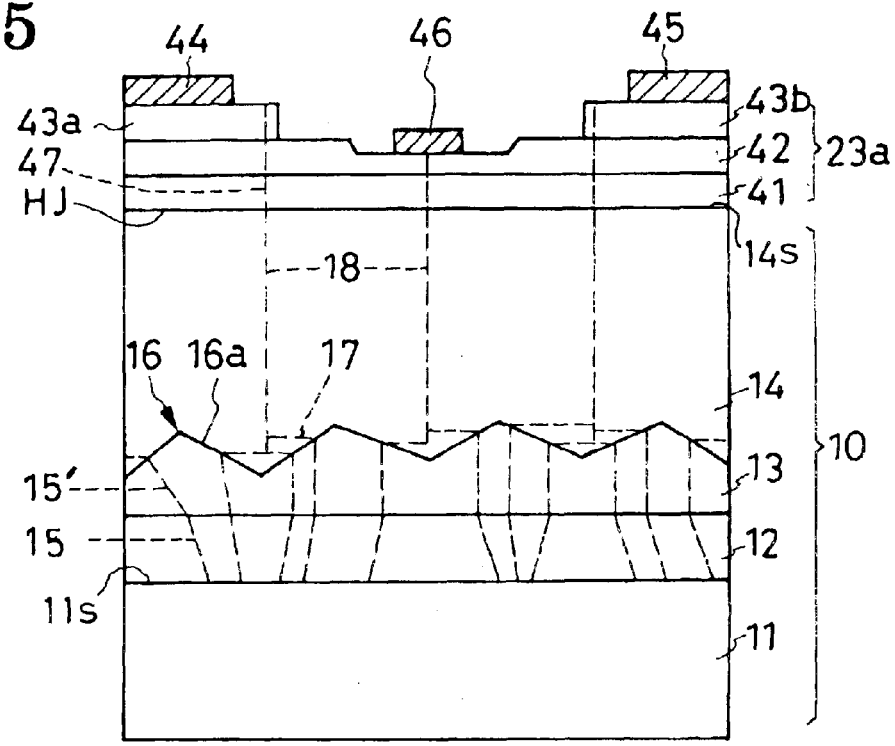
FIG. 5 is a diagrammatic sectional view of the semiconductor substrate of FIG. 1 shown as a part of a heterojunction field-effect transistor.

Embodiment of FIG. 5

FIG. 5 shows a high-electron-mobility, heterojunction field-effect transistor created by forming a semiconductor device region 23$_a$ for that transistor on the semiconductor substrate 10 of the same construction as that shown in FIG. 2. The semiconductor device region 23$_a$ comprises an electron source layer or electron supply layer 41 of AlGaN doped with n-type impurities, a Schottky-forming layer 42 not doped with impurities, a source contact layer 43$_a$, and a drain contact layer 43$_b$.

The electron supply layer 41 was formed directly on the leveling region 14, by introducing into the reaction chamber 33 μmol/min (10 cc) of TMG, 12.5 μmol/min (5 cc) of TAM, 20 nmol/min (200 cc) of SiH$_4$, and 0.14 mol/min (3 l.) of NH$_3$. An Al$_{0.3}$Ga$_{0.7}$N layer was thus grown epitaxially on the leveling region 14 to a thickness of 30 nanometers. Containing silicon for n-type conductivity, the electron supply layer 41 makes a heterojunction with the underlying leveling layer 14, so that a two-dimensional electron gas layer (current channel) is created at and adjacent the interface HJ between these regions.

The impurity-free Schottky-forming layer 42 was grown epitaxially on the electron supply layer 41, and on this layer 42 there were grown epitaxially both source contact layer 43$_a$ and drain contact layer 43$_b$. A source electrode 44 was formed on the source contact layer 43$_a$, a drain electrode 45 on the drain contact layer 43$_b$, and a gate electrode 45 in Schottky contact with the Schottky-forming layer 42. The noted two-dimensional electron gas layer provides a current channel between source electrode 44 and drain electrode 45, which is under the control of the gate electrode 46.

In this transistor, too, the semiconductor device region 23$_a$ has dislocations 47 existing therein as extensions from the dislocations 18 in the leveling region 14. These dislocations 47 are just as scarce as the dislocations 18 are. The scarce dislocation density of the semiconductor device region 23$_a$ leads to reduction in the dispersion of carriers due to the electrons captured by the dislocations, thereby conducing to greater mobility.

Figure 6:
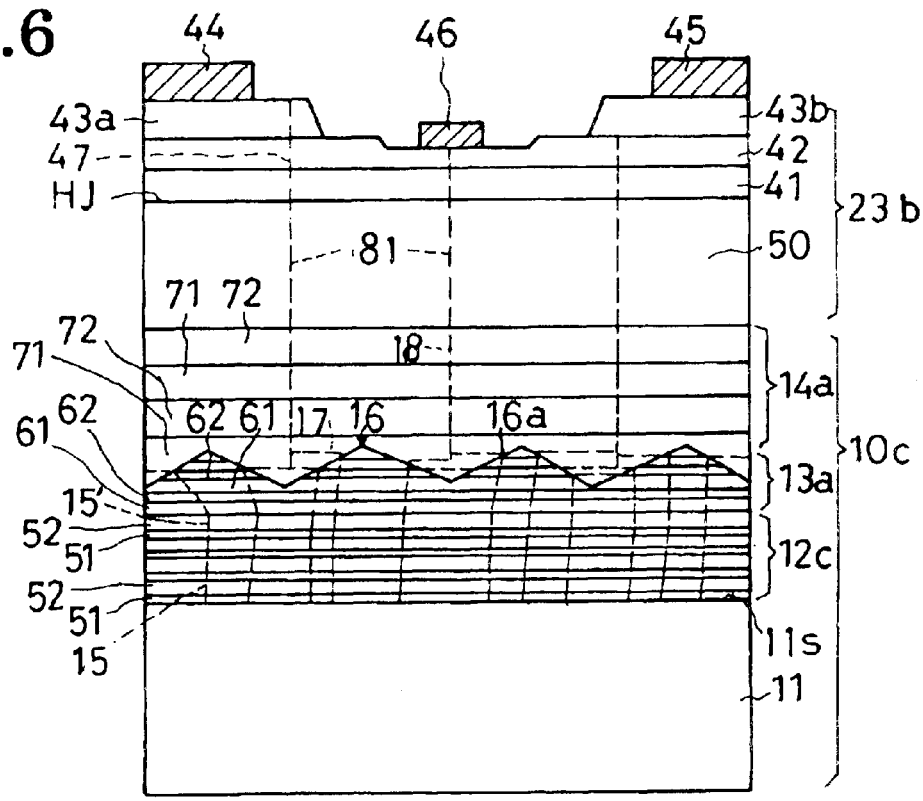
FIG. 6 is a diagrammatic sectional view of a further preferred form of semiconductor substrate according to the invention, the substrate being shown as a part of a heterojunction field-effect transistor.

Embodiment of FIG. 6

Another heterojunction field-effect transistor shown in FIG. 6 is a combination of a modified semiconductor substrate 10$_c$ and modified semiconductor device region 23$_b$. Similar in function to the FIG. 5 semiconductor substrate 10, the modified semiconductor substrate 10$_c$ comprises the silicon baseplate 11, a buffer region 12$_c$, a dislocation refracting region 13$_a$, and a leveling region 14$_a$. A GaN semiconductor region 50, shown included in the semiconductor device region 23$_b$ to be detailed subsequently, might be considered a subregion of the leveling region 14$_a$ of the semiconductor substrate 10$_c$.

The buffer region 12$_c$ on the silicon baseplate 11 is an alternation of a plurality of AlN layers 51 and a plurality of GaN layers 52. Here again the four AlN layers 51 and four GaN layers 52 shown in FIG. 6 are for the sake of simplicity only; in practice, about ten such layers 51 and as many layers 52 may be employed. These layers 51 and 52 can be formed by the same methods as are the AlN layers 31, FIG. 4, and GaN layers 32 of the first buffer subregion 21$_a$ of the buffer region 12$_b$ of the semiconductor substrate 10$_b$. The only difference structural difference between the FIG. 4 buffer region 12$_b$ and the FIG. 6 buffer region 12$_c$ is the numbers of their constituent layers: The former has twenty AlN layers 31 and twenty GaN layers 32 whereas the latter has ten AlN layers 51 and ten GaN layers 52. It will also be observed from FIGS. 4 and 6 that the buffer region 12$_c$ has no counterpart of the second buffer subregion 22'.

Overlying the buffer region 12$_c$, which does not contain indium, is the dislocation refracting region 13$_a$ of an indium-containing nitride semiconductor. This dislocation refracting region 13$_a$ is also of multilayer construction having alternating two layers 61 and 62 of different compositions. The first layers 61 are of In$_x$Ga$_{1-x}$N where x is greater than zero and less than one. The second layers 62 are of $In_aGa_{1-a}N$ where a is greater than zero, less than one, and greater than x. A specific example of composition for the first layers 61 is $In_{0.01}Ga_{0.99}N$, and that for the second layers 62 $In_{0.2}Ga_{0.8}N$.

For OMVPE fabrication of the multilayered dislocation refracting region $13_a$ after that of the buffer region $12_c$, the charging of the growth materials other than $NH_3$ into the reaction chamber was terminated. Then, after allowing the baseplate 11 to cool down to 800° C., the required proportions of TMIn, TMG and $SiH_4$ were introduced into the reaction chamber together with $NH_3$. One first layer 61 of $In_{0.01}Ga_{0.99}N$ was thus grown epitaxially to a thickness of 13 nanometers. Then the proportion of TMIn was made greater to cause one second layer 62 of $In_{0.2}Ga_{0.8}N$ to grow epitaxially on the first layer 61 to a thickness of three nanometers. The same cycle of creating one first layer 61 and one second layer 62 was repeated 10 times to complete the dislocation refracting region $13_a$.

Both first and second layers 61 and 62 of the dislocation refracting region $13_a$ contain indium, so that numerous protuberances 16 are created on its major surface, as on that of the first disclosed dislocation refracting region 13. Although the layers 61 and 62 of the dislocation refracting region $13_a$ are all shown for simplicity to be parallel to the major surface of the baseplate 11 in FIG. 6, these layers are corrugated at least in part to expedite the formation of the protuberances.

The first layers 61 of the dislocation refracting region $13_a$ might also be termed barrier layers, and the second layers 62 well layers. Containing silicon for determination of its conductivity type, the dislocation refracting region $13_a$ is electroconductive.

The leveling region $14_a$ overlying the dislocation refracting region $13_a$ is shown as an alternating lamination of two first layers 71 and two second layers 72. This showing is for simplicity only; in practice, there may be provided about ten first layers 71 and as many second layers 72. The first layers 71 are made from an aluminum-containing nitride generally expressed as $Al_xGa_{1-x}N$ where x is greater than zero and less than one. The second layers 72 are made from a gallium-containing nitride generally defined as $Al_yGa_{1-y}N$ where y is equal to or greater than zero, less than one, and less than x.

In this particular embodiment, however, the first layers 71 are made from AlN, each with a thickness of five nanometers, and the second layers 72 from GaN, each with a thickness of 25 nanometers. These layers 71 and 72 are shown as approximately equal in thickness in FIG. 6 by way of contradistinction of the leveling region $14_a$ from the dislocation refracting region $13_a$. Actually, they differ in thickness like the layers 51 and 52 of the buffer region $12_c$. The same in composition as the layers 51 and 52, respectively, the layers 71 and 72 can be made by the same methods therewith. The leveling region $14_a$ has a flat major surface, without any such protuberances as those of the dislocation refracting region $13_a$, as its constituent layers 71 and 72 both do not contain indium. The leveling region $14_a$ has far less dislocations 81 than does the dislocation refracting region $13_a$ as the dislocations 15' across the latter are mostly refracted by the sloping flanks $16_a$ of the protuberances 16.

The semiconductor device region $23_b$ of the FIG. 6 transistor is a lamination of the GaN semiconductor region 50, electron supply layer 41, Schottky-forming layer 42, source contact layer $43_a$, and drain contact layer $43_b$. Except for the GaN semiconductor region 50, this semiconductor device region $23_b$ is akin in construction to that of the FIG. 5 transistor. As has been mentioned, however, the GaN semiconductor region 50 could be excluded from the semiconductor device region $23_b$ and considered a part of the leveling region $14_a$.

The GaN semiconductor region 50 is formed on the leveling region $14_a$ to a thickness of about 300 nanometers by the same method as the GaN leveling region 14 of the FIG. 2 substrate 10. The current channel due to the two-dimensional electron gas is created at and adjacent the heterojunction HJ between electron supply layer 41 and GaN semiconductor region 50.

In this FIG. 6 transistor, too, the dislocation refracting region $13_a$ makes the leveling region $14_a$ and semiconductor device region $23_b$ drastically less in dislocation density than the buffer region $12_c$, enabling the transistor to gain the same advantages as does the FIG. 5 transistor. Experiment proved that the carrier mobility of the FIG. 6 transistor is 1200 $cm^2/V·s$, compared to that of 800 $cm^2/V·s$ exhibited by the transistor of the FIG. 6 construction except for the absence of the dislocation refracting region $13_a$. The carrier mobility has become 1.5 times as high as heretofore thanks to the present invention.

A further advantage of the FIG. 6 embodiment results from the multilayer construction of the buffer region $12_c$. The multilayer buffer region $12_c$ performs the same favorable functions as does the multilayer buffer region $12_b$ of the FIG. 4 embodiment.

A still further advantage arises from the multilayer construction of the dislocation refracting region $13_a$ comprising two different kinds of layers 61 and 62 containing different proportions of indium. This construction serves to add to the distribution density of the protuberances 16 and hence to correspondingly lessen the dislocation density of the semiconductor device region $23_a$.

Additionally, the leveling region $14_a$ is also of multilayer design having alternating AlN and GaN layers. This design is conducive to the provision of a more level surface than is possible with a single-layer leveling region.

Possible Modifications

It is not desired that the present invention be limited to the exact details of the foregoing disclosure. A variety of changes are possible without departure from the scope of this invention as expressed in the attached claims. The following is a brief list of possible modifications, alternations or substitutions which are all believed to fall within the purview of the present invention:

1. The semiconductor device region 23 of the FIG. 3 LED could be formed on the FIG. 6 semiconductor substrate 10 instead of on the substrate $10_a$.

2. The semiconductor device region $23_a$ of the FIG. 5 heterojunction field-effect transistor could be formed on the FIG. 4 semiconductor substrate $10_b$ instead of on the substrate 10.

3. The dislocation refracting region 13 of the FIGS. 2–5 substrates 10, $10_a$ and $10_b$ could be of multilayer construction like the dislocation refracting region $13_a$ of the FIG. 6 substrate $10_c$.

4. The leveling region 14 of the FIGS. 2–5 substrates 10, $10_a$ and $10_b$ could likewise be of multilayer construction like the leveling region $14_a$ of the FIG. 6 substrate $10_c$.

5. The multilayered first buffer subregion $21_a$ of the FIG. 4 substrate $10_b$, and the multilayered buffer region $12_c$, multilayered dislocation refracting region $13_a$ and multilayered leveling region $14_a$ of the FIG. 6 substrate $10_c$ could all be provided with additional layers of different compositions as required in each specific application of the invention.

6. The substrates $10$, $10_a$, $10_b$ and $10_d$ may, or may not, be doped for specific conductivity types.

7. The substrates according to the invention may be used for fabrication of semiconductor devices other than LEDs and heterojunction field-effect transistors disclosed herein, such as metal-semiconductor field-effect transistors, heterojunction bipolar transistors, and insulated-gate field-effect transistors.

What is claimed:

1. A method of fabricating a semiconductor substrate for a com-pound semiconductor device, comprising:
   (a) providing a baseplate of a substance that permits epitaxial growth of compound semiconductors thereon;
   (b) creating a buffer region by causing a first compound semiconductor to grow epitaxially on the baseplate, the buffer region possibly containing dislocations;
   (c) creating a dislocation refracting region on a major surface of the buffer region by causing a second compound semiconductor, different from the first compound semiconductor, to grow epitaxially on the major surface of the buffer region, the dislocation refracting region having a major surface with a multiplicity of protuberances capable of refracting extensions of the dislocations from the buffer region; and
   (d) creating a leveling region on the major surface of the dislocation refracting region by causing a third compound semiconductor, different from the second compound semiconductor, to grow epitaxially on the major surface of the dislocation refracting region, the leveling region having a major surface of greater levelness than the major surface of the dislocation refracting region;
   (e) whereby the leveling region is less in dislocation density than the buffer region and the dislocation refracting region as the dislocations created in the buffer region are refracted away from the leveling region by the protuberances on the major surface of the dislocation refracting region.

2. The method of claim 1 wherein the second compound semi-conductor for the dislocation refracting region is an indium-containing nitride.

3. The method of claim 1 wherein the dislocation refracting region is formed by:
   (a) creating a first layer on the major surface of the buffer region by causing a first nitride to grow epitaxially thereon, the first nitride containing indium in a first proportion;
   (b) creating a second layer on the first layer by causing a second nitride to grow epitaxially thereon, the second nitride containing indium in a second proportion that is greater than the first proportion; and
   (c) repeating the steps (a) and (b) a prescribed number of times.

* * * * *

UNITED STATES PATENT AND TRADEMARK OFFICE
CERTIFICATE OF CORRECTION

PATENT NO.     : 6,890,791 B2
DATED          : May 10, 2005
INVENTOR(S)    : Ohtsuka et al.

It is certified that error appears in the above-identified patent and that said Letters Patent is hereby corrected as shown below:

Column 5,
Line 44, delete "$\mu$mol/min" and insert therefor -- nmol/min --.

Signed and Sealed this

Twentieth Day of September, 2005

JON W. DUDAS
*Director of the United States Patent and Trademark Office*